United States Patent [19]
Chu et al.

[11] Patent Number: 5,869,980
[45] Date of Patent: *Feb. 9, 1999

[54] PROGRAMMING PROGRAMMABLE TRANSISTOR DEVICES USING STATE MACHINES

[75] Inventors: Michael Hsiao-Ming Chu, Fremont; Rakesh H. Patel, Cupertino, both of Calif.

[73] Assignee: Altera Corporation, San Jose, Calif.

[*] Notice: The term of this patent shall not extend beyond the expiration date of Pat. No. 5,650,734.

[21] Appl. No.: 896,146

[22] Filed: Jul. 17, 1997

Related U.S. Application Data

[63] Continuation of Ser. No. 570,117, Dec. 11, 1995, Pat. No. 5,650,734.

[51] Int. Cl.[6] .............................................. H03K 19/177
[52] U.S. Cl. .............................................. 326/38; 326/40
[58] Field of Search ................................ 326/38–41, 46; 365/189.01, 189.08

[56] References Cited

U.S. PATENT DOCUMENTS

| | | |
|---|---|---|
| 4,706,216 | 11/1987 | Carter . |
| 4,783,606 | 11/1988 | Goetting ..................................... 326/38 |
| 4,870,302 | 9/1989 | Freeman ..................................... 326/41 |
| 4,873,459 | 10/1989 | El Gamal et al. . |
| 4,879,688 | 11/1989 | Turner et al. . |
| 4,896,216 | 1/1990 | Turner et al. . |
| 5,297,103 | 3/1994 | Higuchi . |
| 5,371,422 | 12/1994 | Patel . |
| 5,457,651 | 10/1995 | Rouy . |
| 5,543,730 | 8/1996 | Cliff et al. . |
| 5,581,198 | 12/1996 | Trimberger ................................ 326/38 |
| 5,650,734 | 7/1997 | Chu et al. ................................... 326/38 |

OTHER PUBLICATIONS

H. Bleeker et al., *Boundary–Scan Test;A Practical Approach*, Kluwer Academic Publishers, Dordrecht, 1993, p. 21.

"IEEE Standard Test Acess Port and Boundary–Scan Architecture, " IEEE Std 1149.1–1990 (Includes IEEE Std 1149.1a–1993), Institute of Electrical and Electronics Engineers, Inc., New York, N.Y., Oct. 21, 1993.

"FLEXlogic Application Support Manual, A Collection of Application Notes," Intel Corporation, Dec. 1993.

C. Brown, "Overview of In–Circuit Reconfiguration and Reprogramming for the Flexlogic iFX8160 , " Intel Corporation, Mar. 1994.

Lattice In–System Programmabilty Manual 1994, Lattice Semiconductor Corporation.

Lattice Handbook 1994, Lattice Semiconductor Corporation.

*Primary Examiner*—Jon Santamauro
*Attorney, Agent, or Firm*—Fish & Neave; Robert R. Jackson; G. Victor Treyz

[57] ABSTRACT

An integrated circuit with programmable transistors is programmed via a state machine on the integrated circuit. For example, the integrated circuit may be a programmable logic device, and the state machine may be a JTAG state machine. Each integrated circuit may have on it a register containing data indicating how long a particular programming operation should continue in order to be successful for that circuit. External programming control apparatus first reads that data and then at least partly bases the timing of programming instructions applied to the integrated circuit on that data. The integrated circuit may have an on-board programming voltage generating circuit which is turned on only by appropriate instructions from the external programming control apparatus. The external programming control apparatus controls the sequence and timing of all programming operations via the state machine port of the integrated circuit.

4 Claims, 14 Drawing Sheets

ISP ROW PROGRAM  TCK FREQUENCY = 10MHZ

| CURRENT STATE(1) (HEX) | TMS (2) | TCK(3) CYCLES | NEXT STATE (HEX) | TDI (HEX) | COMMENTS |
|---|---|---|---|---|---|
| F  102 | 0 | 1 | C | XXX | |
| C | 1 | 1 | 7 | XXX | |
| 7 | 1 | 1 | 4 | XXX | |
| 4 | 0 | 1 | E | XXX | |
| E | 0 | 1 | A | XXX | |
| A | 0 | 9 | A | NNN | LOAD CLR/SP, CLEAR ALL REG. NNN REPRESENTS INSTRUCTION CODE. |
| A | 1 | 1 | 9 | XXX | |
| 9 | 1 | 1 | D | XXX | ISP /CLRREG HIGH |
| D | 0 | 1 | C | XXX | |
| C | 0 | 3 | C | XXX | |
| C | 1 | 1 | 7 | XXX | |
| 7 | 1 | 1 | 4 | XXX | |
| 4 | 0 | 1 | E | XXX | |
| E | 0 | 1 | A | XXX | |
| A | 0 | 9 | A | NNN | SELECT WORD LINE REG. NNN REPRESENTS INSTRUCTION CODE. |
| A | 1 | 1 | 9 | XXX | |
| 9 | 0 | 1 | B | XXX | |
| B | 0 | 36 | B | XXX | 5uS DELAY |
| B | 1 | 1 | 8 | XXX | |
| 8 | 1 | 1 | D | XXX | |

FIG. 5b

FROM FIG. 5b

| | | | | | |
|---|---|---|---|---|---|
| 6 | 0 | 1 | 2 | XXX | SHIFT-IN COL. DATA FOR ARRAY,MC,GV,GH,GHIO,MV,GHIO OR PERI. ??? REPRESENTS TDI INPUT PATTERN. |
| 2 | 0 | LLL(5) | 2 | ???... | |
| 2 | 1 | 1 | 1 | | |
| 1 | 1 | 1 | 5 | XXX | |
| 5 | 1 | 1 | 7 | XXX | |
| 7 | 1 | 1 | 4 | XXX | |
| 4 | 0 | 1 | E | XXX | |
| E | 0 | 1 | A | XXX | |
| A 150 | 0 | 9 | A | NNN | LOAD TM NNN REPRESENTS INSTRUCTION CODE. |
| A | 1 | 1 | 9 | XXX | |
| 9 | 0 | 1 | B | XXX | 5 US DELAY |
| B | 0 | 36 | B | XXX | |
| B | 1 | 1 | 8 | XXX | |
| 8 | 1 | 1 | D | XXX | |
| D | 0 | 1 | C | XXX | |
| C | 0 | 3 | C | XXX | TM HIGH |
| C 160 | 1 | 1 | 7 | XXX | |
| 7 | 1 | 1 | 4 | XXX | |
| 4 | 0 | 1 | E | XXX | |
| E | 0 | 1 | A | XXX | |
| A | 0 | 9 | A | NNN | LOAD NTPW NNN REPRESENTS INSTRUCTION CODE. |
| A | 1 | 1 | 9 | XXX | |
| 9 | 0 | 1 | B | XXX | |

FIG. 5d (FROM FIG. 5c)

| | | | | | |
|---|---|---|---|---|---|
| B | 0 | 36 | B | XXX | DELAY |
| B | 1 | 1 | 8 | XXX | |
| 8 | 1 | 1 | D | XXX | |
| D | 0 | 1 | C | XXX | |
| C | 0 | 1 MILLION | C | XXX | NTPW PULSE 100 |
| C | 1 | 1 | 7 | XXX | |
| 7 | 1 | 1 | 4 | XXX | |
| 4 | 0 | 1 | E | XXX | |
| E | 0 | 1 | A | XXX | 5 us DELAY |
| A | 0 | 46 | A | XXX | |
| A | 0 | 9 | A | NNN | LOAD CLRREG INSTRUCTION NNN REPRESENTS INSTRUCTION CODE. |
| A | 1 | 1 | 9 | XXX | |
| 9 | 0 | 1 | B | XXX | |
| B | 0 | 1 | 8 | XXX | TM LOW |
| 8 | 1 | 1 | D | XXX | |
| D | 1 | 1 | C | XXX | |
| C | 0 | 3 | C | XXX | |
| C | 0 | 1 | 7 | XXX | CLRREG HIGH |
| 7 | 1 | 1 | 4 | XXX | |
| 4 | 1 | 1 | F | XXX | RESET |

NOTE: (1) ALL STATES ARE THE STATES OF JTAG STATE MACHINE.
(2) TMS LEVEL "0" INDICATES VSS LEVEL "1" INDICATES VCC.
(3) THE STATE CHANGES DURING TCK RISING EDGE.
(4) THE LLL IS RESPECTIVE REG. CHAIN LENGTH-1
(5) "X" IS DON'T CARE.

FIG.6

| | | |
|---|---|---|
| 201 | 000 00000 1 0 | TM |
| 202 | 000 00010 1 0 | NTPW |
| 203 | 111 00011 1 0 | BULK ERASE |
| 204 | 111 00100 1 0 | CLEAR REGISTER |
| 205 | ??? 00101 1 0 | SELECT ARRAY DATA REGISTER LEFT |
| 206 | ??? 00110 1 0 | SELECT ARRAY DATA REGISTER RIGHT |
| 207 | 000 00111 1 0 | SELECT WORDLINE REGISTER |
| 208 | ??? 01000 1 0 | SELECT MACROCELL SCAN REGISTER LEFT |
| 209 | ??? 01001 1 0 | SELECT MACROCELL SCAN REGISTER RIGHT |
| 210 | ??? 01010 1 0 | SELECT GH DATA REGISTER |
| 211 | 000 01011 1 0 | SELECT PERIPHERY DATA REGISTER |
| 212 | 000 01100 1 0 | SELECT GHIO DATA REGISTER |
| 213 | 000 01101 1 0 | GH MARGIN HIGH LOAD |
| 214 | 000 01110 1 0 | GH MARGIN LOW LOAD |
| 215 | 000 01111 1 0 | MACROCELL MARGIN HIGH LOAD |
| 216 | 000 10000 1 0 | MACROCELL MARGIN LOW LOAD |
| 217 | 000 10001 1 0 | PERIPHERY/GHIO MARGIN HIGH LOAD |
| 218 | 000 1 010 1 0 | PERIPHERY/GHIO MARGIN LOW LOAD |
| 219 | 000 10011 1 0 | SELECT MS WORDLINE |

FIG. 8a

ISP BULK ERASE  TCK FREQUENCY = 10MHZ

| CURRENT STATE(1) (HEX) | TMS (2) | TCK(3) CYCLES | NEXT STATE (HEX) | TDI (HEX) | COMMENTS |
|---|---|---|---|---|---|
| F (301) | 0 | 1 | C | XXX | |
| C | 1 | 1 | 7 | XXX | |
| 7 | 1 | 1 | 4 | XXX | |
| 4 (305) | 0 | 1 | E | XXX | |
| E | 0 | 1 | A | XXX | |
| A | 0 | 9 | A | NNN | LOAD CLR/ISP, CLEAR ALL REG NNN REPRESENTS INSTRUCTION CODE. |
| A | 1 | 1 | 9 | XXX | |
| 9 (310) | 1 | 1 | D | XXX | |
| D | 0 | 3 | C | XXX | ISP HIGH/CLRREG |
| C | 1 | 1 | 7 | XXX | |
| 7 | 1 | 1 | 4 | XXX | |
| 4 | 0 | 1 | E | XXX | |
| E | 0 | 1 | A | XXX | |
| A (315) | 0 | 9 | A | NNN | LOAD TM NNN REPRESENTS INSTRUCTION CODE. |
| A | 1 | 1 | 9 | XXX | |
| 9 | 0 | 1 | B | XXX | |
| B | 0 | 36 | B | XXX | 5 DELAY |
| B | 1 | 1 | 8 | XXX | |
| 8 | 1 | 1 | D | XXX | |

TO FIG. 8b

FROM FIG. 8a

| | | | | | |
|---|---|---|---|---|---|
| D | 0 | 1 | C | XXX | |
| C | 0 | 3 | C | XXX | TM HIGH |
| C | 1 | 1 | 7 | XXX | |
| 7 | 1 | 1 | 4 | XXX | |
| 4 | 0 | 1 | E | XXX | |
| E | 0 | 1 | A | XXX | LOAD BE |
| A | 0 | 9 | A | NNN | NNN REPRESENTS INSTRUCTION CODE, |
| A | 1 | 1 | 9 | XXX | |
| 9 | 0 | 1 | B | XXX | |
| B | 0 | 36 | B | XXX | 5us DELAY |
| B | 1 | 1 | 8 | XXX | |
| 8 | 1 | 1 | D | XXX | |
| D | 0 | 1 | C | XXX | |
| C | 0 | 3 | C | XXX | BE HIGH |
| C | 1 | 1 | 7 | XXX | |
| 7 | 1 | 1 | 4 | XXX | |
| 4 | 0 | 1 | E | XXX | |
| E | 0 | 1 | A | XXX | LOAD NTPW |
| A | 0 | 9 | A | NNN | NNN REPRESENTS INSTRUCTION CODE, |
| A | 1 | 1 | 9 | XXX | |
| 9 | 0 | 1 | B | XXX | |
| B | 0 | 36 | B | XXX | 5us DELAY |
| B | 1 | 1 | 8 | XXX | |

| State | | | | FROM FIG.8b → | |
|---|---|---|---|---|---|
| 8 | 1 | 1 | | D | |
| D (345) | 0 | 1 | | C | |
| C | 0 | 0 | 1 million | XXX | NTPW PULSE 100ms |
| C | 1 | 1 | 1 | XXX | |
| 7 | 1 | 1 | 1 | 4 | |
| 4 | 0 | 0 | 1 | XXX | |
| E (350) | 0 | 0 | 1 | XXX | |
| A | 0 | 0 | 46 | XXX | 5us DELAY |
| A | 0 | 0 | 9 | NNN | LOAD CLRREG INSTRUCTION NNN REPRESENTS INSTRUCTION CODE. |
| A | 1 | 1 | 1 | 9 | |
| 9 (355) | 0 | 0 | 1 | XXX | BE LOW |
| B | 0 | 0 | 48 | XXX | 5us DELAY |
| B | 1 | 1 | 1 | 8 | |
| 8 | 1 | 1 | 1 | XXX | TM LOW |
| D | 0 | 0 | 1 | XXX | |
| C | 0 | 0 | 3 | XXX | CLRREG HIGH |
| C (360) | 1 | 1 | 1 | XXX | |
| 7 | 1 | 1 | 1 | XXX | |
| 4 | 1 | 1 | 1 | F | RESET |

NOTE: (1) ALL STATES ARE THE STATES OF JTAG STATE MACHINE. (2) TMS LEVEL '0' INDICATES VSS AND LEVEL '1' INDICATES VCC. (3) THE STATE CHANGES DURING TCK RISING EDGE. (4) 'X' IS DON'T CARE.

FIG. 8c

PROGRAMMING PROGRAMMABLE TRANSISTOR DEVICES USING STATE MACHINES

This is a continuation of application Ser. No. 08/570,117, filed Dec. 11, 1995 entitled PROGRAMMING PROGRAMMABLE TRANSISTOR DEVICES USING STATE MACHINES, now U.S. Pat. No. 5,650,734.

BACKGROUND OF THE INVENTION

This invention relates to programming programmable transistor devices such as programmable logic devices.

There are many types of non-volatile programmable devices that require an electrical charge to be stored on or erased from transistors on the device in order to program or erase the device. Programmable logic devices and read-only memories employing EPROM, EEPROM, or flash transistors are examples of such devices. In order to successfully program or erase such transistors, a programming or erasing potential must be applied to the transistor for a particular amount of time. Although all units of a given device may be intended to be made with the same programming or erasing time interval, this parameter may in fact vary from batch to batch or even from device to device. For example, minor process variations from batch to batch may cause variation in the programming or erasing time interval parameter. If all devices must be programmed or erased at the speed of the slowest possible device, programming or erasing will be unnecessarily slowed for many devices.

It would therefore be desirable to have a custom programming or erasing speed for each of a plurality of programmable devices so that each device can be programmed or erased at a speed that is appropriate for that device.

Some programmable devices may not be programmed until after they are part of a larger assembly (e.g., after they have been assembled with other components on a printed circuit board). Particularly under these "in-system" programming conditions, it may be desirable to program or erase the device through a relatively small number of pins on the device in order to avoid having to use more extensive system resources for programming or erasing. For example, it is known to program programmable devices through a so-called JTAG interface. This interface is a standard specified in "IEEE Standard Test Access Port and Boundary-Scan Architecture", IEEE Std 1149.1-1990 (includes IEEE Std 1149.1a-1993), published by the Institute of Electrical and Electronics Engineers, Inc. on Oct. 21, 1993. JTAG programming requires use of only a small number of pins such as TMS (test mode select), TCK (test clock), TDI (test data in), and TDO (test data out). However, programming is not just a matter of applying programming data to a programmable device. It may also be necessary to place the device in programming or erasing mode by applying several control signals in a particular sequence (e.g., to avoid signal contention on the device). It may also be necessary to apply a particular programming or erasing potential to the device, which potential may be different from potentials normally applied to the device.

It would therefore be desirable to allow more complete control of the programming or erasing process through a port such as the JTAG port so that additional pins do not have to be used for applying other programming or erasing mode control signals and/or for applying special programming or erasing potentials.

In view of the foregoing, it is an object of this invention to improve the programming of programmable devices by facilitating customization of programming and/or erasing speed to more closely match the programming or erasing speed requirements of each individual device.

It is another object of this invention to improve and simplify programming of programmable devices through a communication port such as a JTAG port.

SUMMARY OF THE INVENTION

These and other objects of the invention are accomplished in accordance with the principles of the invention by providing programmable devices which have stored on them data indicating the time interval required to program or erase each individual device. Before programming or erasing of a device begins, this information is read out by the programming apparatus. The programming apparatus uses this information to set programming or erasing time intervals which are customized for the device to be programmed or erased. The device is then programmed or erased using these customized time intervals. This avoids having to program or erase all devices at the relatively slow rate that would be suitable for the slowest device.

Another aspect of the invention relates to including on a device to be programmed or erased circuitry which generates special programming or erasing potentials from the ordinary potentials that are applied to the device. This circuitry is turned on or off under the control of a state machine (e.g., the conventional JTAG state machine) which is also included on the device. This reduces the need for special programming connections to the device. It also reduces risk of damage to the device by ensuring that these special programming or erasing potentials are only present at the proper time during the programming or erasing control sequence, which is also preferably controlled by the state machine as will be summarized in the next paragraph.

Still another aspect of the invention relates to controlling the programming or erasing mode control signals via the above-mentioned state machine. This again reduces the need for special connections to the device. And it helps ensure that these control signals are activated and deactivated in the proper sequence and at the proper times.

Further features of the invention, its nature and various advantages will be more apparent from the accompanying drawings and the following detailed description of the preferred embodiments.

BRIEF DESCRIPTION OF THE DRAWINGS

FIG. 3 per se is well known in the art.

FIGS. 5a–5d (collectively referred to as FIG. 5) are charts showing successive steps in an illustrative programming operation in accordance with this invention.

FIG. 6 is a table of illustrative in-system programming instructions in accordance with this invention.

FIGS. 8a–8c (collectively referred to as FIG. 8) are charts similar to FIG. 5, but showing another illustrative programming operation in accordance with this invention.

DETAILED DESCRIPTION OF THE PREFERRED EMBODIMENTS

Figure 1:
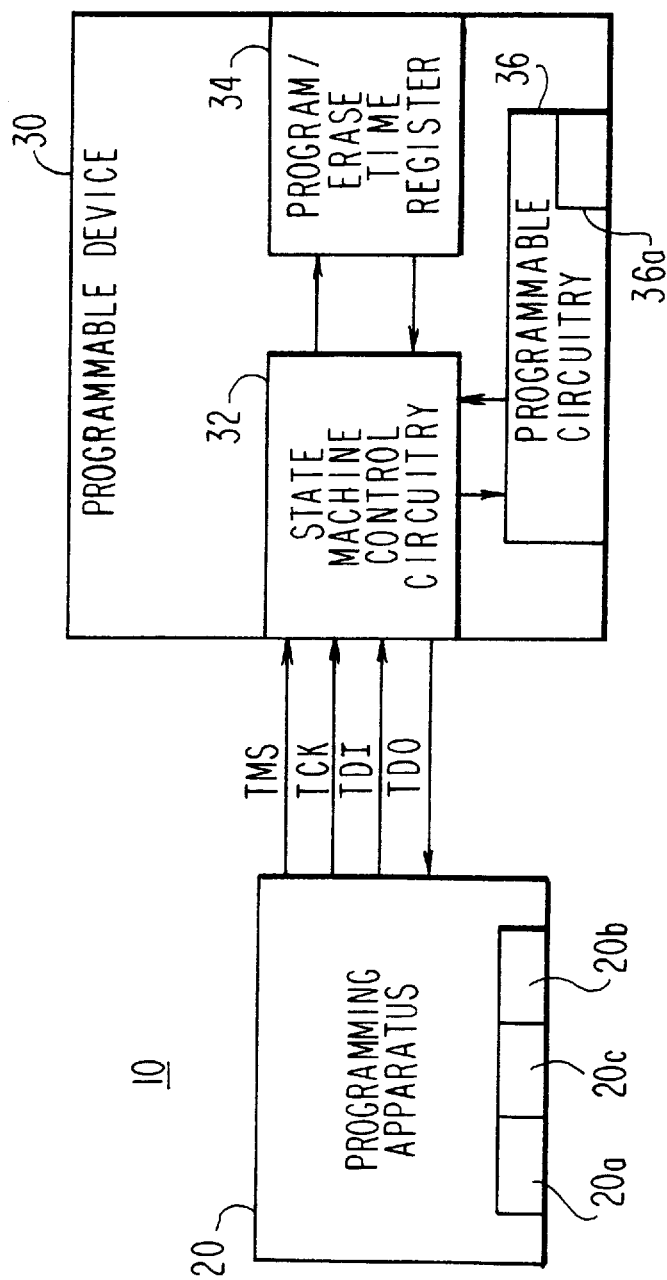
FIG. 1 is a simplified block diagram of a system for programming and/or erasing a programmable device in accordance with this invention.

In the illustrative system 10 shown in FIG. 1 programming apparatus 20 programs and/or erases programmable device 30 through an interface which can be the conventional JTAG interface or another state machine interface. (To simplify the following discussion the terms "program", "programming", or the like will often be used to refer to programming and/or erasing, although it will also sometimes be necessary to specifically refer to erasing. It will be understood from the context when the "programming" terminology may also include erasing.) Programming apparatus 20 may be any apparatus suitable for generating signals like TMS, TCK, and TDI, and for responding to signals like TDO in order to program device 30. For example, apparatus 20 may be a suitably programmed microprocessor with associated program and data memory or memories. Programming apparatus 20 is generally only connected to programmable device 30 during programming of device 30.

Programmable device 30 may be any device (typically an integrated circuit) having transistors that require programming. For example, device 30 may be a programmable logic device of the type shown in Patel et al. U.S. Pat. No. 5,371,422 or a read only memory device. Programmable device 30 includes state machine control circuitry 32, which may be conventional JTAG state machine circuitry or the like. (More detail regarding possible state machine circuitry is provided below.) Programmable device 30 also includes program/erase time register 34. After device 34 has been manufactured, it is tested to determine how much time is required to program the programmable transistors on that device (e.g., how long the programming potential must be applied to a selected transistor in order to program that transistor). This information is then stored (preferably permanently) in register 34, which thereafter functions as a read only memory for that information. For example, memory 34 may be a fuse or antifuse register memory in which the program/erase time data is recorded by selectively "blowing" fuses or by selectively fusing antifuses.

When it is desired to program device 30 (and programming apparatus 20 is accordingly connected to it as shown in FIG. 1), programming device 20 first issues the TMS, TCK, and TDI signals required to address register 34 via state machine control circuitry 32. Programming apparatus 20 then reads out the program/erase time data stored in register 34. For example, this data may be read out via TDO, with each data bit being synchronized with a respective TCK signal pulse. When programming apparatus 20 has retrieved this information, it uses that information to determine how many TCK clock signal pulses correspond to the program/erase time interval required by device 30. For example, if the TCK signal frequency is 10 MHz, and the program/erase time data stored in register 34 indicates that device 30 requires the programming potential to be applied for 100 milliseconds in order to program a transistor on that device, then programming apparatus 20 determines that the programming potential must be applied for one million TCK signal cycles. Or in more general terms, the number of TCK signal cycles required to program a transistor on device 30 is given by the TCK signal frequency (typically a characteristic of programming device 20) times the program/erase time interval stored in register 34.

After programming apparatus 20 has made use of the data from register 34, it can begin to actually program the programmable circuitry 36 on device 30. To do this, programming apparatus 20 issues the TMS, TCK, and TDI signals required to address transistors in circuitry 36 to be programmed and to cause programming potential to be applied to those transistors for the number of TCK signal cycles determined as described above to correspond to the program/erase time interval required for device 30. More detail regarding these kinds of programming operations is provided below. Element 36a in FIG. 1 is a high voltage pump circuit used during programming of programmable circuitry 36 as is more fully described below. Element 20a in FIG. 1 may be a register for storing the number of TCK signal cycles that programming apparatus 20 has determined as described above is an appropriate programming time interval for device 30. Element 20b may be a counter for counting TCK signal cycles during each programming interval. And element 20c may a comparator for comparing the count contained in counter 20b to the contents of register 20a in order to produce an output signal indicating that the programming interval can stop when the contents of counter 20b equal or exceed the contents of register 20a.

Figure 2:
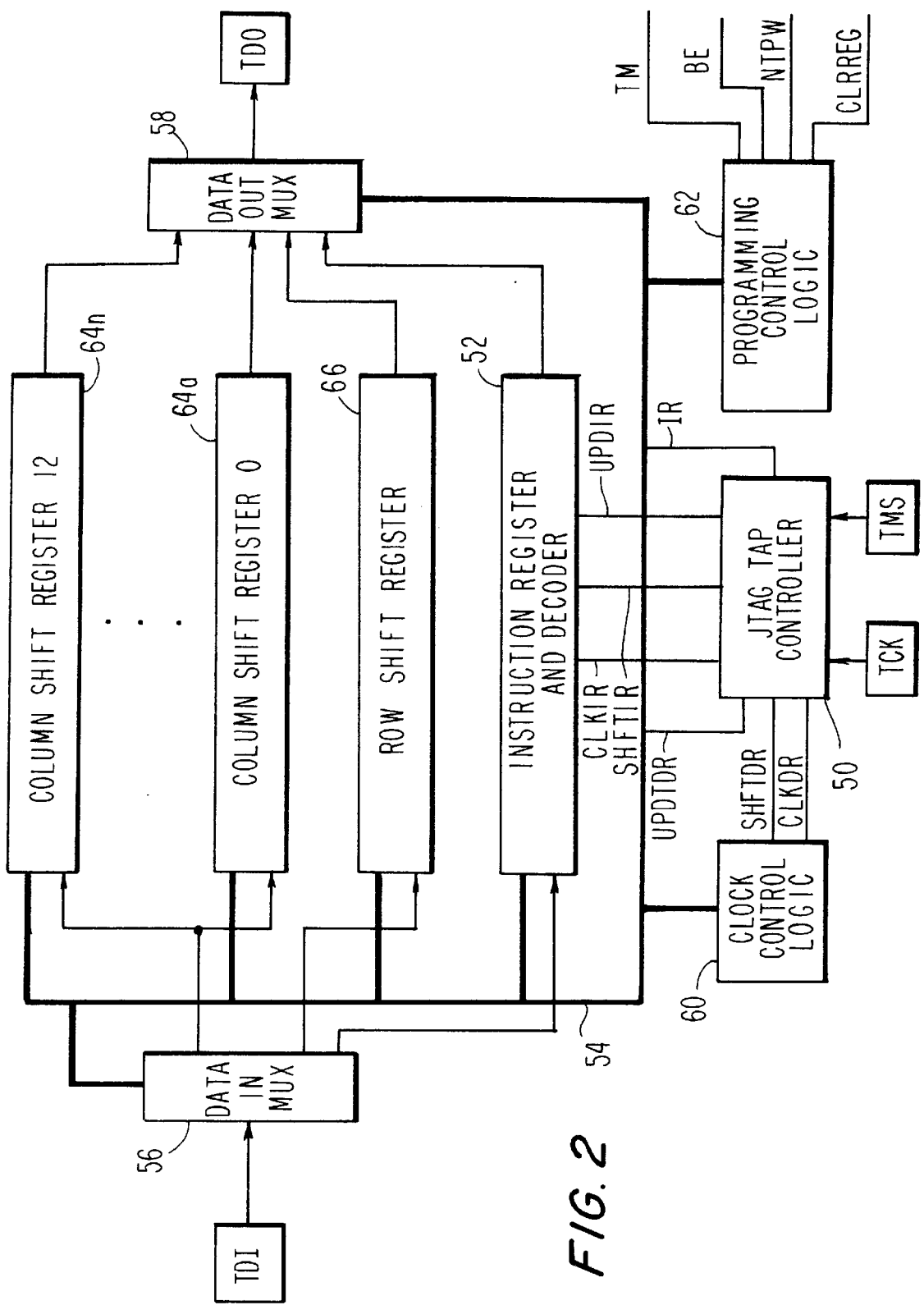
FIG. 2 is a more detailed, but still simplified, block diagram of an illustrative embodiment of a portion of the FIG. 1 system in accordance with this invention.
Figure 3:
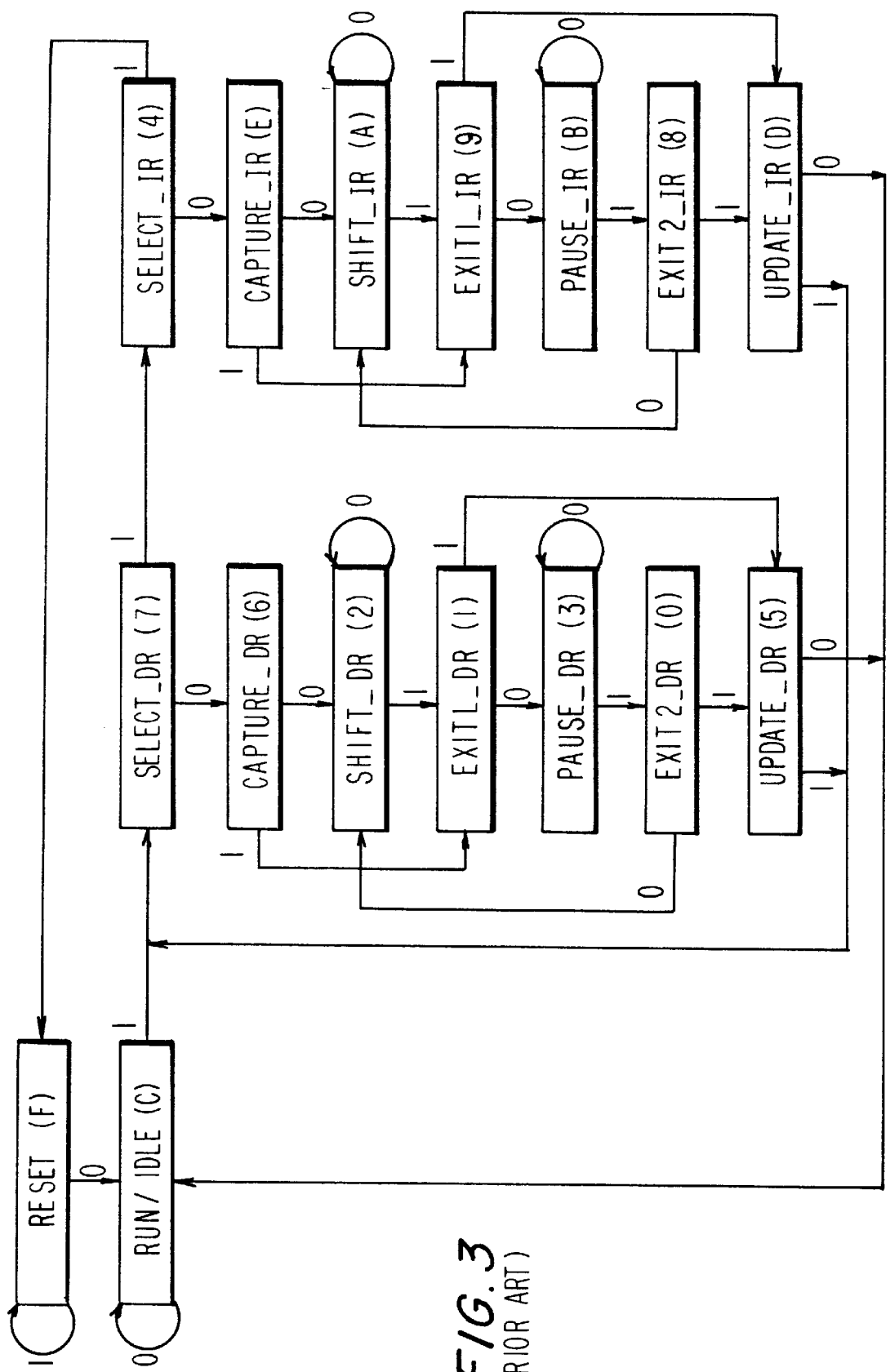
FIG. 3 is a flow chart of illustrative states of a portion of the apparatus of FIG. 2.

FIG. 2 shows a preferred embodiment of portions of an illustrative programmable device 30 in more detail. The actual state machine is represented by box 50. In the depicted preferred embodiment state machine 50 operates according to the standard JTAG states (shown in FIG. 3), but it will be understood that another type of state machine with a different set of states could be employed if desired. State machine 50 begins operating in the reset state (state F in FIG. 3). Each time state machine 50 receives a TCK pulse, it either remains in its present state or changes to a new state, depending on the level of the TMS signal at the time of the TCK pulse. For example, if state machine 50 is in reset state F, it remains in that state as long as TMS is 1. This is indicated in FIG. 3 by the "1" next to the loop which recirculates to state F. As soon as TMS is found to be 0 when a TCK pulse is received, state machine 50 changes to run/idle state C. This is indicated in FIG. 3 by the "0" next to the line running from state F to state C. State machine 50 remains in state C as long as TMS is 0. As soon as TMS is found to be 1 when a TCK pulse is received, state machine 50 changes to select DR (data register) state 7. This discussion will be sufficient to make it clear how the TMS signal, synchronized with the TCK signal, can cause state machine 50 to assume any of its various states. IR in FIG. 3 stands for instruction register.

State machine 50 produces an IR output signal which is applied to programmable logic connectors ("PLCs") 56 and 58 via bus 54. This IR signal causes PLC 56 to apply TDI signals to instruction register and decoder 52 unless state machine 50 is in data register states in the middle column in FIG. 3. In these data register states, the IR signal changes to allow the TDI signal to be applied to data registers such as 64 and 66. PLC 58 is controlled similarly by the IR signal (i.e., when TDI is applied to instruction register and decoder 52, an output signal of component 52 is applied to TDO; but otherwise an output signal of a data register such as 64 or 66 can be applied to TDO).

Depending on its state, state machine 50 may also produce such output signals as CLKIR (clock instruction register), SHFTIR (shift instruction register), UPDIR (update instruction register), CLKDR (clock data register), SHFTDR (shift data register), and/or UPDTDR (update data register). The CLKIR, SHFTIR, and UPDIR signals will be considered first in connection with instruction register and decoder 52. (The UPDTDR signal is used only in the JTAG mode, not in the in-system programming ("ISP") mode which is currently being discussed, but it is shown in FIG. 2 for completeness.)

In FIG. 2 instruction register and decoder 52 receives the CLKIR, the SHFTIR, the UPDIR, and (via PLC 56) the TDI signals as inputs. In order for instruction register 52 to receive an instruction, state machine 50 is placed in its shift IR state A. In this condition state machine 50 applies CLKIR and SHFTIR signals to register 52. The CLKIR signal is the TCK signal that state machine 50 has received. The SHFTIR signal is a control signal for causing register 52 to operate like a shift register in response to each CLKIR signal pulse by shifting in data applied to the TDI input terminal.

When instruction register 52 has been filled with the desired instruction data, state machine 50 is changed to its update IR state D. In this condition state machine 50 applies an UPDIR control signal to register 52. This causes register 52 to latch in and decode the instruction data it has received. The control signals that result from the decoding performed by element 52 are applied via bus 54 to such elements as PLCs 56 and 58, clock control logic 60, programming control logic 62, column shift registers 64a-n, and row shift register 66. The control signals on bus 54 can control PLC 56 to direct the TDI signal to row shift register 66 or to column shift registers 64. PLC 56 may thus be thought of as a signal distributor or demultiplexer. PLC 58 is an inverse type of device (e.g., a multiplexer) for directing data shifted through any of registers 64 or 66 to TDO. In this context TDO may be used to pass data on to the TDI input of another device 30 if two or more devices are to be programmed from one programming apparatus 20 connection. The control signals on bus 54 from element 52 can control clock control logic 60 to apply the SHFTDR and CLKDR signals from state machine 50 to appropriate leads on bus 54. The control signals on bus 54 can also cause programming control logic 62 to generate programming control signals such as TM (tunnel mode), BE (bulk erase), NTPW (tunneling pulse width), and CLRREG (clear register). These signals are applied to programmable circuitry 36 in order to control various aspects of the programming of that circuitry as will be discussed in more detail below.

In order to program programmable circuitry 36, the various programmable memory locations in that circuitry must be addressed (selected) and then written to (i.e., programmed by storing a suitable electrical charge in a transistor device at that memory location or removing a previously stored electrical charge from the transistor device at that location). In general, all memory locations will initially be in one of two possible programmable states (logic 1 or logic 0), so it will only be necessary to address and program the memory locations whose initial state needs to be changed. The other memory locations can be left in their initial state by simply skipping over them during the programming process.

Figure 4:
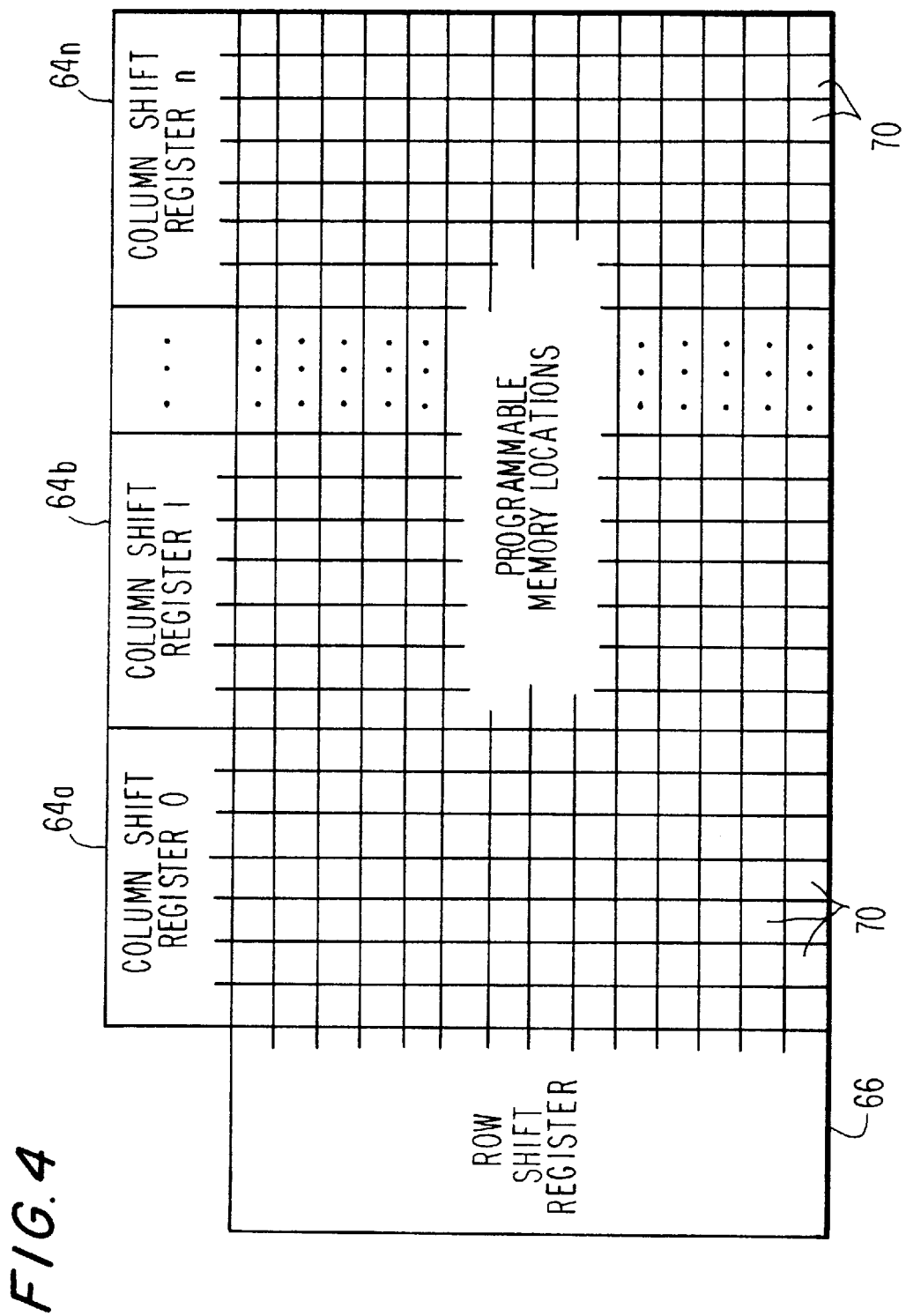
FIG. 4 is a simplified diagram showing addressing of particular transistors to be programmed, based on row and column addresses of those transistors.

Each memory location can be thought of as being effectively at the intersection of a row location and a column location. In the illustrative embodiment being described one row location register is shared by several column location registers (see FIG. 4). Thus a particular memory location 70 in programmable circuitry 36 is addressed when both its row is selected (e.g., by a logic 1 in the row shift register 66 stage associated with that row) and its column is selected (e.g., by a logic 1 in the column shift register 64 stage associated with that column). In response to instructions entered into instruction register 52 as described above, row shift register 66 is selected and then loaded with row selection data. Then one or more column shift registers 64 are selected and loaded with column selection data. Lastly, programming control logic circuitry is controlled to produce the signal sequence needed to program the memory location(s) 70 at the intersection(s) of the row and column selection data in registers 64 and 66. This process is repeated as many times as required to program the entire array of memory locations 70. More detail will now be provided about what has just been said by referring to the illustrative programming sequence shown in FIG. 5.

Figure 7:
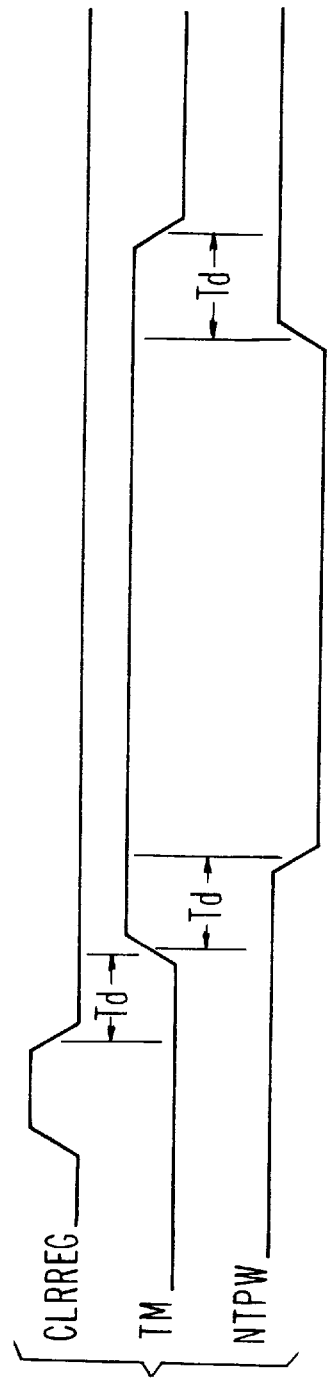
FIG. 7 shows parts of several programming control signal waveforms that result from performing the steps of FIG. 5.

In step 101 in FIG. 5 state machine 50 starts out in state F as shown in FIG. 3 and as has been previously described. In successive steps 102, 103, etc., programming apparatus 20 (FIG. 1) moves state machine 50 through states C, 7, 4, and E to state A by appropriate control of the TMS signal during successive TCK pulses. (only some of the step reference numbers 101, 102, 103, etc., are actually shown in FIG. 5 to avoid cluttering the drawing.) In steps 106 and 107 state machine 50 remains in state A for ten TCK pulses. During these ten TCK pulses a first 10-bit in-system programming ("ISP") instruction is shifted into instruction register 52 from programming apparatus 20 via the TDI terminal. An illustrative ISP instruction set is shown in FIG. 6. The instruction shifted in steps 106 and 107 is clear register instruction 204, the purpose of which is to clear all of registers 64. After instruction 204 has been shifted into instruction register 52, programming apparatus 20 causes state machine 50 to change to state 9 (step 108) and then to state D (step 109), where the instruction shifted in in steps 106 and 107 is latched into instruction register 52. Programming apparatus 20 then causes state machine 50 to change to state C (step 110), where it remains for four TCK pulses (steps 110 and 111). Unlike standard JTAG operation, in ISP mode the instruction in register 52 is not activated in state D, but rather after the state machine is in state C for two TCK cycles. The instruction is deactivated upon leaving state C. Thus in response to the sequence shown in FIG. 5, programming control logic 62 (FIG. 2) produces a CLRREG output signal pulse that lasts approximately two TCK cycles (the last TCK cycle of step 110 and the cycle of step 111) (see also FIG. 7). This is sufficient time for clear register instruction 204 to clear all of registers 64.

After step 111, programming apparatus 20 causes state machine 50 to progress through state 7 (step 112), state 4 (step 113), state E (step 114), and back to state A for ten more TCK cycles (steps 115 and 116). During these last two steps programming apparatus 20 shifts another ten-bit ISP instruction into instruction register 52 through the TDI terminal. In this case the instruction is select wordline register instruction 207 (FIG. 6). Programming apparatus 20 then causes state machine 50 to pass through state 9 (step 117), state B (steps 118 and 119), and state 8 (step 120) to state D (step 121), where the instruction just shifted in is latched into instruction register 52. State machine 50 then changes to state C (steps 122 and 123) where it remains for four TCK cycles. This is sufficient time for select wordline register instruction 207 to control PLC 56 to connect the TDI input terminal to row shift register 66.

After step 123 state machine 50 passes through states 7 and 6 to state 2 (steps 126 and 127), where it remains for as many TCK cycles as there are stages in row shift register 66. While state machine 50 is in state 2, programming apparatus 20 applies to the TDI terminal the data needed to make row selections as described above in connection with FIG. 4. Clock control logic circuitry 60 is simultaneously controlled by the select wordline register instruction in register 52 to apply the SHFTDR and CLKDR signals from state machine 50 to row shift register 66. This causes row shift register 66 to shift in the row selection data applied to the TDI terminal.

When all the row selection data has been shifted into register 66, programming apparatus 20 causes state machine 50 to change to state 1 (step 128) and then to state 5 (step 129). State machine 50 thereafter changes to state 7, state 4, state E, and back to state A for ten TCK cycles (steps 133 and 134) to shift in another ten-bit ISP instruction.

This time the instruction shifted in (from programming apparatus 20 to instruction register 52) is one of instructions 205, 206, 210, 211, or 212. These instructions identify the column shift register or registers 64 that are to receive the subsequent column selection data. There are several different instructions of this type because there may be memory locations for several different purposes. For example, instructions 205 and 206 are to respectively select the column registers 64 associated with either a programmable logic AND-array left-hand portion or a programmable logic AND-array right-hand portion in programmable circuitry 36. Moreover, there may be several column registers 64 associated with each left- or right-hand portion, and one or more of these column registers may be selected in any combination. This selection is made by the three left-most bits in instruction 205 or 206. Instruction 210 selects any one or more of several column registers 64 associated with memory locations 70 for controlling programmable GH (global horizontal) interconnection conductors in programmable circuitry 36. Again, the three left-most bits in instruction 210 select the one or more of these registers. Instruction 211 selects the column shift register 64 associated with memory locations 70 for controlling programmable features in the peripheral logic of circuitry 36 (e.g., whether certain pins will be input pins or output pins, whether or not inputs or output will be registered, etc.). Instruction 212 selects the column shift register 64 associated with memory locations 70 for controlling programmable interconnections between the above-mentioned GH conductors and the IO (input/output) in the periphery of programmable circuitry 36.

Steps 135–139 are respectively similar to steps 117–121 and result in latching into instruction register 52 the column shift register selection instruction. The result is control of PLC 56 to direct subsequent TDI signals to the appropriate one or more of column shift registers 64. Clock control logic circuitry 60 is also controlled to direct the SHFTDR and CLKDR signals to registers 64.

Steps 140–145 are respectively similar to steps 122–127 and result in shifting column selection data (from programming apparatus 20 via the TDI terminal and PLC 56) into the selected column shift registers 64. Steps 146 and 147 are similar to steps 128 and 129.

Steps 148–157 are respectively similar to steps 130–139 and result in a new instruction from programming apparatus 20 being stored in instruction register 52. In this case the instruction is TM (tunnel mode) instruction 201. This instruction controls programming control logic circuitry 62 to produce the TM output signal which causes programmable transistors in programmable circuitry 36 to enter their tunnel mode (particularly required in the case of EEPROM transistors). The TM output of programming control logic 62 goes high after the first two TCK pulses of step 158, and remains high until step 179. (See FIG. 7 for the timing relationship between the various outputs of programming control logic circuitry 62 during programming mode. Note that step 154 ensures that there is at least a minimum time interval Td between the end of the CLRREG pulse and the start of the TM pulse. The number of TCK pulses during which state machine 50 is held in state B in step 154 may be based in part on data read from programming device 30 as described above in connection with FIG. 1, and may therefore differ from part to part.)

Steps 160–169 are respectively similar to steps 148–157 and result in the NTPW (tunneling pulse width) instruction 202 being shifted into instruction register 52. This instruction controls programming control logic circuitry 62 to produce the NTPW output signal while state machine 5C is in state C. The NTPW signal (going low, during steps 170 and 171) turns on a high voltage pump circuit which is internal to programmable device 30 and which is shown as element 36a in FIG. 1. When thus turned on, this pump circuit produces the high voltage signal needed to store charge on the programmable transistors of device 30 (or to remove charge from those transistors). In accordance with this invention, programming apparatus 20 keeps state machine 50 in state C (steps 170 and 171) long enough to ensure that sufficient electrical charge is stored on (or removed from) the programmable transistors to fully program them. The manner in which programming apparatus 20 preferably determines how many TCK cycles state machine 50 should be held in state C is described above in connection with FIG. 1. In FIG. 5 the reference to 1 million TCK cycles to produce an NTPW pulse of 100 milliseconds assumes a TCK frequency of 10 MHz, but all of these specific numbers are merely illustrative, and any or all of them may be different in different applications. The NTPW signal returns to its normal high state when state machine 50 exits from state C at the end of step 171.

It should also be noted in connection with FIG. 5 that programming apparatus 20 holds state machine 50 in state B (step 166) for a sufficient number of TCK cycles to ensure that the NTPW pulse does not begin until at least a time interval Td (see FIG. 7) after the TM pulse begins. This ensures that the programmable transistors are fully in tunnel mode before the high voltage programming signal is applied to them. This control of the sequence and relative timing of the TM and NTPW signal avoids possible damage to the programmable transistors that may otherwise be caused by the high programming voltage. The number of TCK pulses during which state machine 50 is held in state B may be based in part on data read from programmable device 30 as described above in connection with FIG. 1, and may therefore differ from part to part.

Steps 172–177 are similar to steps 160–164 (with the addition of step 175 to ensure another delay of at least Td between the end of the NTPW pulse and the end of the TM pulse (see again FIG. 7)). (Again, the amount of this delay may be partly based on data read from device 30 as described above in connection with FIG. 1 (see also the above discussion of step 166).) These steps result in the loading of clear register instruction 204 into instruction register 52. Steps 178 and 179 are similar to steps 165 and 166. (TM is caused to go low by detection of (1) NTPW high, and (2) leaving state 8.) Steps 181–183 are similar to steps 109–111 and cause another CLRREG pulse. Thereafter, state machine 50 can be returned to reset state F (after step 185), or step 185 can be modified so that the process loops back to step 114 to continue the programming process with different row and column selection data.

FIG. 8 shows another example of a control sequence in accordance with this invention. The purpose of this sequence is to perform a bulk erase ("BE") operation on a programmable device 30. A BE operation erases all of the programmable transistors on the device (e.g., to prepare it for reprogramming with a different program).

Steps 301–310 are similar to steps 101–110, and therefore do not need to be described again.

Steps 311–322 are similar to steps 148–159, and therefore do not need to be fully described again.

Figure 9:
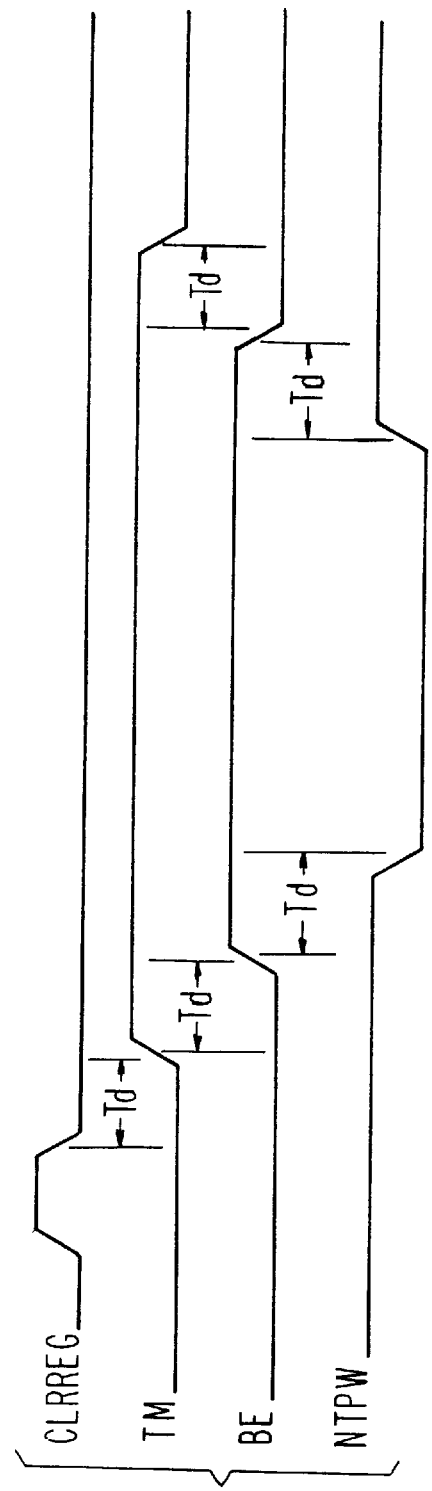
FIG. 9 is similar to FIG. 7, but for the steps of FIG. 8.

Steps 323–334 are generally similar to steps 311–322, except that steps 323–334 result in loading bulk erase instruction 203 into instruction register 52. This causes programming control logic circuitry 62 to begin to produce a BE signal pulse. Step 329 ensures that there is at least a time interval Td after the start of the TM pulse before the BE signal pulse begins (see again FIG. 9). As in the case of steps like step 166, the time delay of step 329 can be partly based on data read from device 30 as described above in connection with FIG. 1.

Steps 335–346 are generally similar to steps 160–171. These steps result in loading NTPW instruction 202 into instruction register 52 and production (by programming control logic circuit 62) of an NTPW pulse of sufficient length to ensure erasing of all the programmable transistors on device 30. Step 341 ensures that there is at least a time interval Td after the start of the BE pulse before the NTPW signal pulse begins (see FIG. 9 once again). Again, this Td delay may be partly based on data read from device 30 as described above in connection with FIG. 1. As discussed above in connection with step 170, programming apparatus 20 preferably determines the length of the NTPW pulse based on data read from program/erase time register 34. The NTPW pulse ends when state machine 50 exits from state C at the end of step 346.

Steps 347–361 are generally similar to steps 172–185. Step 350 ensures a Td delay after the end of the NTPW pulse before the BE signal goes low (in step 353). Step 354 ensures another Td delay after BE goes low before the TM signal goes low (in step 356). Once again, these time delays may be partly based on data read from device 30.

The foregoing is illustrative of how all the ISP instructions shown in FIG. 6 are used. The other ISP instructions that have not yet been specifically mentioned are used similarly to control other programming-related functions through the state machine port. For example, instructions 208 and 209 are used during verification that the programmable transistors associated with the logic macrocells of programmable circuitry 36 have been programmed as intended. Instructions 213 and 214 are used to test whether the amount of charge stored on the programmable transistors associated with the GH interconnections is within thresholds appropriate for the programmed and unprogrammed states of those transistors. Instructions 215 and 216 are similar for the transistors programmed using instructions 205 and 206, and instructions 217 and 218 are similar for the transistors programmed using instructions 211 and 212. Instruction 219 is the instruction that is used to select program/erase time register 34 when it is desired to read out the contents of that register as described above in connection with FIG. 1.

In addition to the ISP instructions shown in FIG. 6, it will be understood that there may be other instructions for controlling other operations of programmable device 30 through state machine control circuitry 32. For example, other conventional JTAG-type operations may be controlled using other instructions.

Figure 10:
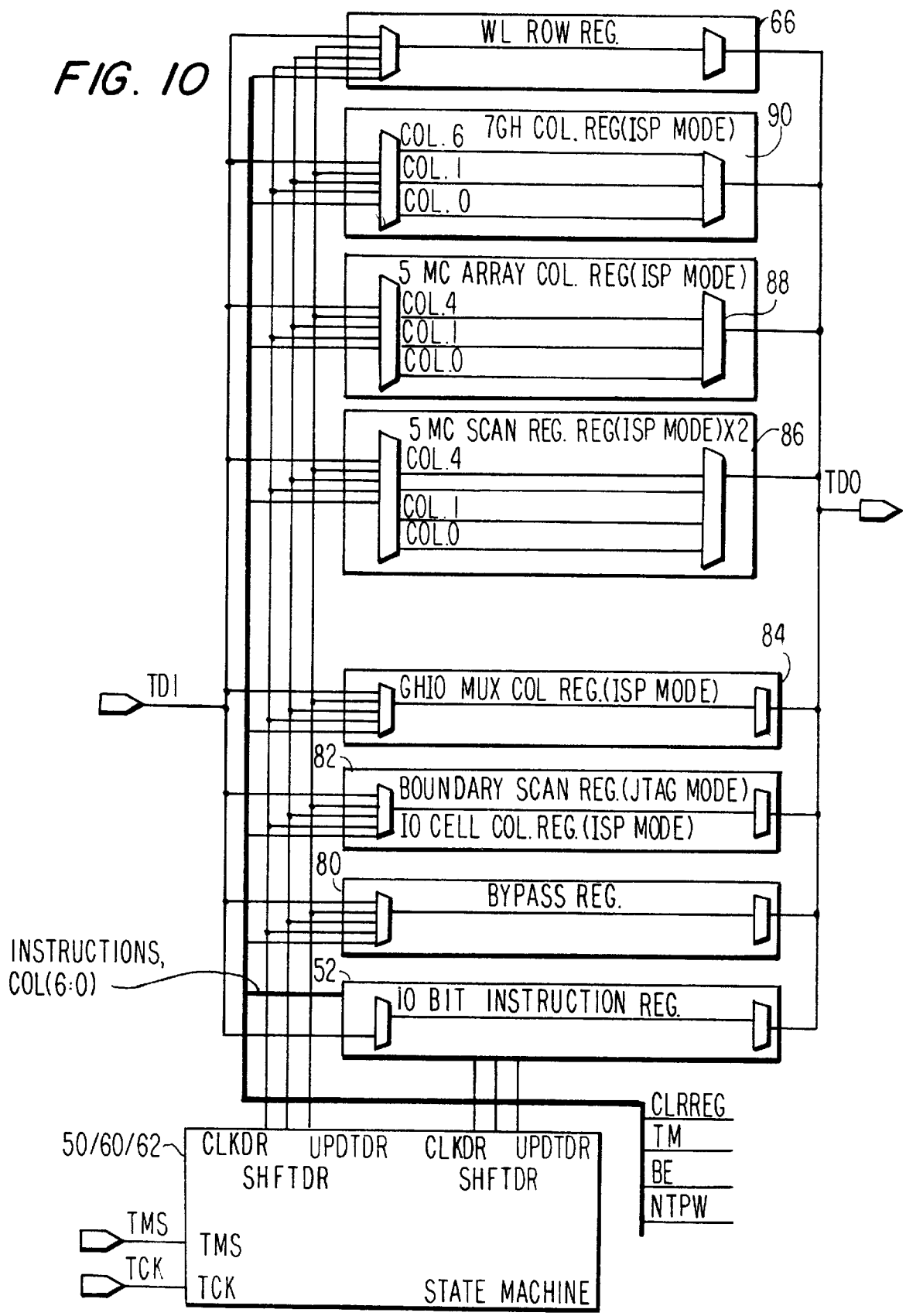
FIG. 10 is a simplified block diagram showing portions of FIG. 2 in somewhat more specific detail.

A more extensive depiction of the registers that may be used in connection with instruction register 52 is shown in FIG. 10. Register 80 is a one-bit bypass register that is conventionally provided in JTAG devices that may be con- nected in series for allowing data to pass through the device from TDI to TDO with only a one-bit delay. Register 82 doubles as the conventional boundary scan register (in JTAG mode) or as the IO cell column register among registers 64 (in ISP mode). Register 84 is the GHIO multiplexer column register among registers 64. Register 86 represents ten macrocell scan registers used with instructions 208 and 209. Register 88 represents five macrocell array column registers among registers 64 (used with instructions 205 and 206). Register 90 represents seven GH column registers among registers 64 (used with instruction 210). Register 66 in FIG. 10 corresponds to register 66 in FIG. 2.

As in conventional JTAG arrangements, the TDO output of device 30 is connected to programming apparatus 20 if there is only one device 30 in the arrangement. On the other hand, if there are several devices 30, the TDO output of the first device 30 is connected to the TDI input of the next and so on until the TDO output of the last is connected back to programming apparatus 20. In the case of multiple devices 30, the TMS and TCK outputs of programming apparatus 20 are connected in parallel to all of those devices 30.

It will be understood that the foregoing is only illustrative of the principles of the invention, and that various modifications can be made by those skilled in the art without departing from the scope and spirit of the invention. For example, the numbers of various types of column registers are only illustrative, and different numbers of such registers can be used for programmable devices of various sizes.

The invention claimed is:

1. Apparatus for programming programmable transistors on an integrated circuit device with programming data comprising:

a storage circuit on said integrated circuit device for storing information on the programming requirements of that particular integrated circuit device, said information being information other than the programming data itself; and programming control apparatus physically separate from said integrated circuit device but electrically connectable thereto for obtaining said information from said storage circuit and for using said information to program said integrated circuit device.

2. Apparatus for programming programmable transistors on an integrated circuit device comprising:

a storage circuit on said integrated circuit device for storing information on the programming requirements of that particular integrated circuit device; and programming control apparatus physically separate from said integrated circuit device but electrically connectable thereto for obtaining said information from said storage circuit and for using said information to program said integrated circuit device, wherein the information on the programming requirements of the particular integrated circuit device comprises information on the time required to program the programmable transistors on that device, the storage circuit being further configured to store the information on the time required to program the programmable transistors.

3. A method of programming programmable transistors on an integrated circuit device with programming data, the integrated circuit device containing a storage circuit in which information on the programming requirements of the integrated circuit device are stored, the information being information other than the programming data itself, comprising the steps of:

reading the information other than the programming data from the storage circuit; and programming the integrated circuit device using the information read from the storage circuit.

4. A method of programming programmable transistors on an integrated circuit device containing a storage circuit in which information on the programming requirements of the integrated circuit device are stored, comprising the steps of:

reading the information from the storage circuit; and programming the integrated circuit device using the information read from the storage circuit, wherein the information on the programming requirements of the integrated circuit device comprises information on the time required to program the programmable transistors on that device, the method further comprising the step of reading the information on the time required to program the programmable transistors from the storage circuit.

\* \* \* \* \*